United States Patent
Ponnapalli et al.

(10) Patent No.: US 6,175,947 B1
(45) Date of Patent: Jan. 16, 2001

(54) METHOD OF EXTRACTING 3-D CAPACITANCE AND INDUCTANCE PARASITICS IN SUB-MICRON VLSI CHIP DESIGNS USING PATTERN RECOGNITION AND PARAMETERIZATION

(75) Inventors: Saila Ponnapalli, Sunnyvale, CA (US); Timothy Lehner, Hopewell Junction, NY (US); Sanjay Upreti, Plano, TX (US)

(73) Assignee: International Business Machines Corporation, Armonk, NY (US)

( * ) Notice: Under 35 U.S.C. 154(b), the term of this patent shall be extended for 0 days.

(21) Appl. No.: 09/062,853

(22) Filed: Apr. 20, 1998

(51) Int. Cl.$^7$ ..................................................... G06F 17/16
(52) U.S. Cl. ...................................................................... 716/5
(58) Field of Search ............................................ 716/14, 5

(56) References Cited

U.S. PATENT DOCUMENTS

| | | | | |
|---|---|---|---|---|
| 5,497,334 | * | 3/1996 | Russell | 716/14 |
| 5,831,870 | * | 11/1998 | Folta | 716/14 |

FOREIGN PATENT DOCUMENTS 9-44550    2/1997    (JP) .

OTHER PUBLICATIONS

Choudhury, et al, "Automatic Generation of Analytical Models for Interconnect Capacitances" IEEE Transactions on Computer–Aided Design of Integrated Circuits and Systems, vol. 14, #4, Apr. 1995, pp. 470–480.

Dai, et al, "3–D Parasitic Extraction for Deep Submicron IC Design" Integrated System Design, Jul. 1997, pp. 22–30.

* cited by examiner

Primary Examiner—Paul R. Lintz
Assistant Examiner—Thuan Do
(74) Attorney, Agent, or Firm—H. Daniel Schnurmann

(57) ABSTRACT

A method for accurately extracting capacitance and inductance parasitics from an electrical network representing a three-dimensional wiring of an integrated circuit chip or module is described. The extraction process can be performed either prior to or after completing a detailed wiring of the chip. In the former case, the method utilizes congestion information and approximate wiring length data to estimate the probability of encountering a particular pattern and the most accurate estimated capacitance which can arrived at. In the latter case, the wiring is partitioned into three-dimensional recognizable patterns, and a database of precomputed parasitics for each pattern is queried in order to obtain highly accurate parasitics within a limited number of machine cycles. The number of patterns is assumed to be sufficiently small to be memory and time efficient and to be arrived at in real-time.

22 Claims, 9 Drawing Sheets

```
70 ── read_technology_information();
71 ── create_wire_definitions();
72 ── initialize_internal_data_structures();
73 ── define_valid_pairs();
74 ── generate_masks_for_valid_pairs();
75 ── store_information_into_database();
76 ── for(pair=0; pair<numberOfValidPairs; pair++) {
       construct_basis_patterns();
         generate_capacitances_for_all_basis_patterns();
         store_capacitances_into_database();
     }
```

FIG. 5

```
Parasitic   *parasitic = new  Parasitic;
Info        *information = new Info;

if( Initialize( information ) ) {
    parasitic->geometry      =   geometry;
    parasitic->reference     =   12;
    parasitic->target        =   1;
    parasitic->capacitance   =   0.0;

if( GetCapacitance(parasitic) ) {
        fprintf(stderr,"Coupling Capacitance is = ");
        fprintf(stderr,"%e\n",parasitic->capacitance);
        fprintf(stderr,"Reference Self Capacitance is = ");
        fprintf(stderr,"%e\n",parasitic->refself);
    }
    else {
        fprintf(stderr,"Invalid query!\n");
        return FALSE;
    }
}
else {
    fprintf(stderr,"Error initializing the database!\n");
    return FALSE;
}
```

METHOD OF EXTRACTING 3-D CAPACITANCE AND INDUCTANCE PARASITICS IN SUB-MICRON VLSI CHIP DESIGNS USING PATTERN RECOGNITION AND PARAMETERIZATION

FIELD OF THE INVENTION

This invention relates to the design of Very Large Scale Integrated Circuit (VLSI) chips utilizing sub-micron technology, and more particularly, to a method of providing an accurate and speedy computation of interconnect parasitics, both before and after completing a detailed wiring and layout of the integrated circuit (IC) chip.

BACKGROUND OF THE INVENTION

As the interconnect density and the operational frequency in a chip increase, the extraction of interconnect parasitics becomes more and more time consuming. This is particularly true if one were to target the extraction of 3-D (three-dimensional) parasitics, and the problem becomes even more complex if one attempts to extract capacitance and inductive parasitics. Inductive extraction is exceedingly time consuming, and accurate results are difficult to obtain. The accuracy cannot be compromised for critical nets, leaving little choice when using conventional extraction procedures, wherein extraction times typically comprise 50% of the design verification process.

In the past, it was sufficient to analyze device delays in great detail while performing crude estimates of interconnect delay for timing closure. By way of example, for noise closure, it was sufficient to isolate nets and perform a SPICE or ASTAP simulation. In view of the shrinkage of IC devices coupled to an increase of dynamic logic and the presence of interconnects having high aspect ratios (which are more densely packed), it becomes increasingly important to analyze interconnect lines as well as devices. Large interconnect parasitics clearly play an important role in the delay and noise. Accordingly, it is important to characterize device parasitics as well as interconnect parasitics. Parasitic inductance is also becoming increasingly relevant as clock frequencies increase and wire resistance decreases. Moreover, it is important to have this characterization available early in the design phase.

Figure 1:
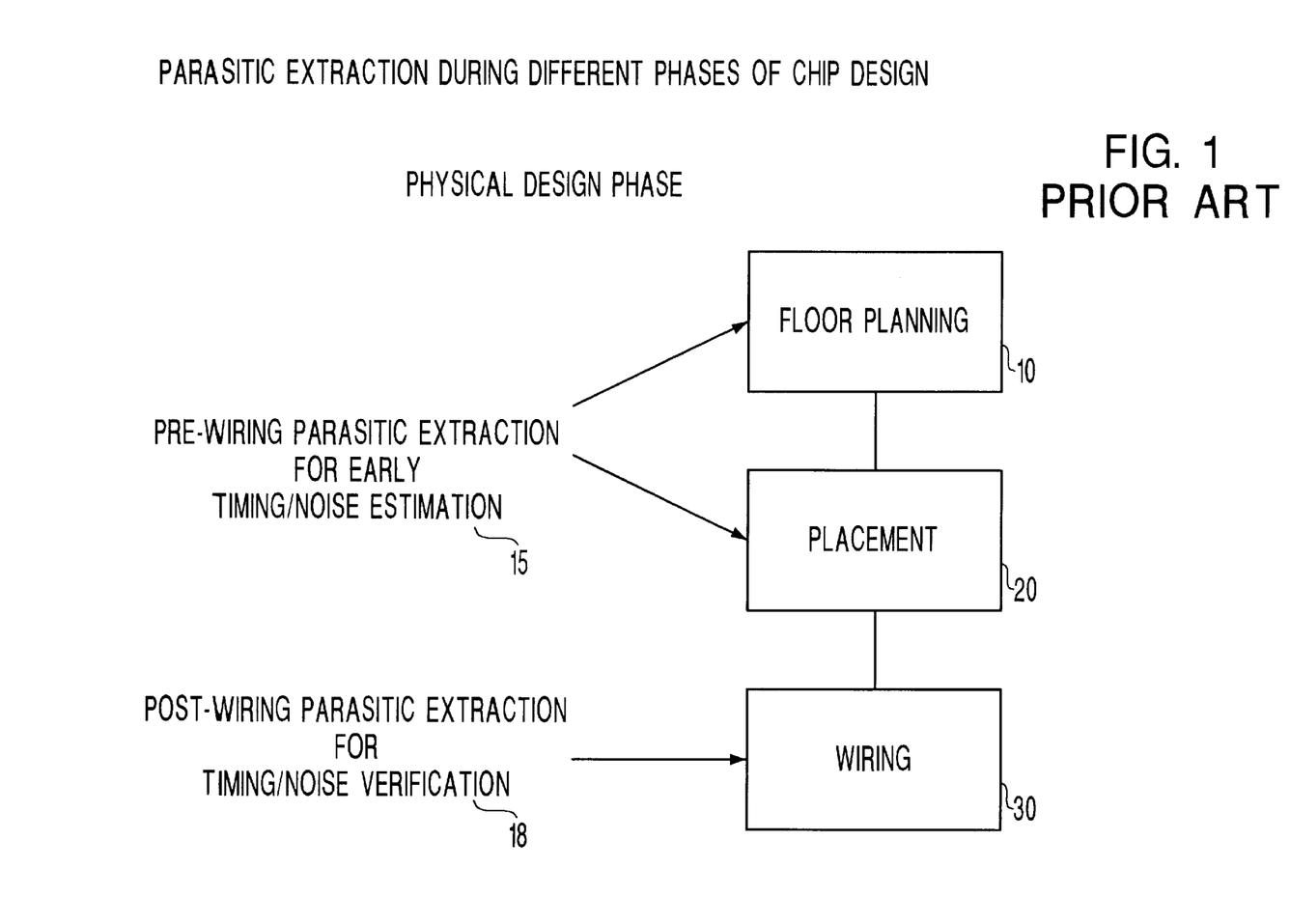
FIG. 1 shows a conventional flow-chart illustrating a prior art parasitic extraction process during the various phases of an IC chip design and, more particularly, how timing and noise characterization are channeled to an earlier availability in the physical design phase.

FIG. 1 illustrates the various stages taking place during the design of a chip, wherein parasitic information that was previously extracted is now utilized for predicting chip timing and noise. Information pertaining to interconnects becomes only known in the last phase, and more particularly, once the physical design has been completed and a detailed wiring of the chip is available.

Practitioners of the art will realize that a conventional physical design (PD) phase, typically consists of a floorplanning stage, a placement stage, and is followed by a wiring phase.

Floorplanning (10) consists of very large-scale positioning, sizing and shaping of the largest circuit blocks and functional units of a chip. This is done with the goal of minimizing timing delay, die area, power consumption and noise. During the floorplanning stage, wires connecting different blocks are not laid out and are thus unknown. At best, delay and noise levels (15) can be estimated so that a better layout can ultimately be chosen. This is achieved by using a probabilistic approach to estimating the environment.

Placement (20) involves moving (placing) circuit blocks within the chip. It is similar to floorplanning in its goals of minimizing power, delay, area and noise. Yet, it differs in that the units that are moved around are smaller, and the overall size and shape of the larger units are fixed. Wiring is still not defined at this point.

During the second stage of the PD stage, and more specifically, during chip/noise verification phase (18), the speed and accuracy of the post-wiring parasitic extraction are critical. During earlier stages of the design, e.g., following floor-planning and placement, but prior to initiating the detailed wiring phase, "approximate" parasitic information based on assumed routing, e.g., a Stiner tree routing (defined as a rectilinear, Manhattan routing connecting all the pins of a net), is helpful in predicting timing and noise information. This approximate information is obtained using probabilities of the presence or absence of surrounding wires, given a certain routing pattern. For both applications, a rapid computation of self and mutual capacitances and inductances in a true 3-Dimensional sense (3-D) is required.

At the wiring stage (30), the blocks laid out during floorplanning and placement are connected with wires (also referred to as interconnects). The exact positioning of the wires is done to minimize delay and noise, both increasing with coupling and self-capacitance.

Self and coupling parasitics of an interconnect wire in its environment are required at this point. By definition, this necessitates a 3-Dimensional analysis involving the specification of surrounding conductors within a certain physical window. The inherent time required to compute capacitance and inductance using a numerical field solver technique precludes it from being used during the extraction process. [Note: a field solver is an algorithmic solution in which an electrostatic and magnetostatic problem are solved using a numeric technique such as a finite element method or a boundary element method]. Approximate two-dimensional equations are very fast, but they yield solutions plagued with high inaccuracies (i.e., as much as 50%–100% in some cases). Crude table look-up overlapping conductors have been accounted for by using Boolean functions which, typically, determine the presence or absence of simple 3-D structures, modeling these structures, storing results in a table, and "adding" the results. This approach leads to inherent inaccuracies because the capacitance of a system of conductors cannot be computed by linear superposition of the capacitances of a subset of the conductors.

Figure 2:
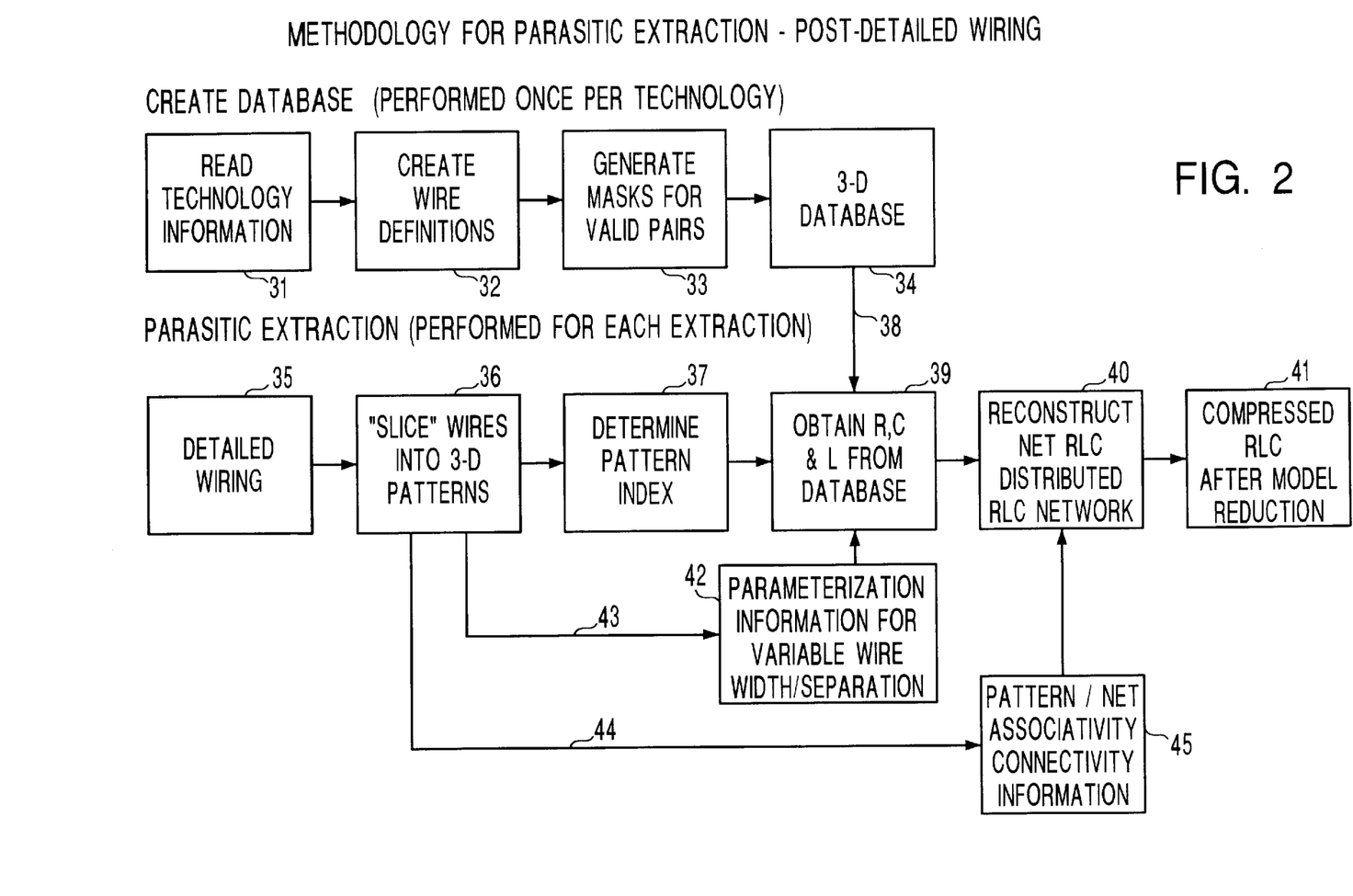
FIG. 2 shows a sequence of steps for extracting parasitics in a post-detailed wiring phase, in accordance with the present invention.

Wherever a rapid and accurate extraction is required, one approach is to break-up a 3-D interconnect configuration into a grid on n×n wires, the minimum value being n=3. If parasitics could be pre-computed for each pattern using a field solver, which would then be stored in a library, it would be possible to query this database on-the-fly to obtain parasitic with greater speed and with the equivalent accuracy of a field solver. This conventional approach, however, suffers from serious drawbacks, namely:

1) In a "pattern" based approach, in order to obtain an acceptable accuracy (e.g., <5%), it is important to consider all vertical layers forming the IC semiconductor chip. For technologies having more than three metalized layers, the number of 3-D configurations in a library quickly expands to unmanageable proportions. By way of example, a typical 5×5×5 grid such as shown in FIG. 2, would have $2^{24}$ patterns in the database. Using a field solver, such as a database, may take as long as 250 days to generate.

2) The ability of handling off-grid wires and wires of arbitrary width which results in the generation of an infinite number of patterns.

In summary, until now conventional methods made use of crude pattern-recognition for technologies not exceeding three metalized layers, using two-dimensional approximations with three dimensional correction terms, and the summation of simple 3-D primitives. These techniques are proving insufficient to handle VLSI products of sub-micron dimensions.

OBJECTS OF THE INVENTION

Accordingly, it is an object of the present invention to provide an accurate and speedy computation of interconnect parasitics both before and after performing a detailed wiring and layout of an IC chip.

It is a further object of the present invention to predict the electrostatic and magnetostatic effects (i.e., a situation when conductor dimensions are much smaller than the wavelength at the highest frequency of interest), i.e., self and mutual capacitance and inductance of conductors within a complex IC environment.

It is another object of the invention to provide a method for accurately computing parasitics with an accuracy of 5% or better, and to achieve it within a reduced number of machine cycles, preferably less than 50.

It is a still another object of the invention to create a database of parasitics of any 3-D patterns to be available in any technology having 3 to 10 layers, with an accuracy better than 5% when compared to the results obtained from a field solver.

It is yet a further object of the invention to account for arbitrary grid spacing and wiring thickness width within the same 5% accuracy range.

It is still another object of this invention to develop a database of 3-D capacitance and inductance values which characterizes 3-D patterns of as many as ten vertical layers and a five by five grid of wires, without exceeding a manageable number of patterns within an acceptable memory and exceeding an acceptable time for generation of the database.

It is yet a further object of this invention to predict wiring capacitances before actual wiring has taken place by using the capacitances and inductances for each 3-D pattern along with a statistical probability of encountering a particular pattern within a Stiner tree routing.

SUMMARY OF THE INVENTION

In accordance with a first aspect of the invention, there is provided a method for extracting interconnect parasitics both before and after completing a detailed wiring of an integrated circuit chip.

For the case when a detailed wiring of the chip was already completed, wiring is "sliced" into 3-D recognizable patterns. A database containing a library of precomputed parasitics for each recognizable pattern (i.e., configuration) is queried in order to obtain highly accurate known parasitics for a given technology.

For the case prior to completing a detailed wiring of an IC chip, there is provided a method for utilizing congestion information and approximate wiring length data to estimate the probability of encountering a specific pattern having the most accurate possible estimated capacitance.

According to another aspect of the invention, there is provided a method of extracting in real time parasitics from an electrical network representing a 3-D wiring of an integrated circuit chip after completing an initial pass of the wiring of the chip, the method including the steps of: partitioning the wiring into recognizable patterns; querying a database of precomputed values of the parasitics of those patterns; and recomposing the electrical network from the initial wiring and the precomputed parasitics.

According to yet another object of the invention, there is provided a method for extracting in real-time parasitics from an electrical network representing a three-dimensional wiring of an integrated circuit chip, prior to completing an initial pass of the wiring of the chip, the method including the steps of: performing a physical design of the chip by executing a floorplanning and placement; selecting a routing for a first wire which connects two pins of the chip; computing a percentage of encounters between the first wire and groups of wires in close proximity to the first wire, the group of wires traversing the first wire; querying a database of precomputed values of the parasitics of each recognizable pattern and computing a probability of the encounters occurring; and determining an accurate estimated parasitic for each of the recognizable patterns by summing up the product of the precomputed parasitics of each of the recognizable patterns and the probability of the encounters.

BRIEF DESCRIPTION OF THE DRAWINGS

While the specification concludes with claims particularly pointing and distinctly claiming what is regarded as the present invention, details of a preferred embodiment of the invention may be more readily ascertained from the technical description when read in conjunction with the accompanying drawings, wherein:

DETAILED DESCRIPTION OF THE PREFERRED EMBODIMENT

As previously mentioned in the Background of the Invention, during the floorplanning stage, the wires connecting different blocks are not laid out and are thus unknown. At best, delay and noise levels can be estimated so that a better layout can ultimately be chosen. Once the physical design phase is complete, extraction is performed knowing the exact locations of all the wires. At the post-placement stage, extraction is performed knowing only the position of the pins which the wires connect, but not the position of the wires. Analysis at this phase aids in early avoidance of timing or noise problems.

The invention can be used both to perform noise and delay avoidance during the wiring process, when wire positions are being chosen and, furthermore, as an accurate extraction tool for post-wiring verification of noise and delay values.

FIG. 2 shows a sequence of steps for extracting parasitics in a post-detailed wiring phase, in accordance with the present invention.

The process requires first inputting the technology data (31). The following quantities are read from a file or prompted by the user: the number of layers in the technology, the spacing and thickness of those layers, the spacing and thickness of the wires, the number of neighbors to each side of a reference wire ("reach"), the dielectric constant, etc. This is followed by the step of creating wire definitions (32), wherein the information from the previous step is used to lay-out a typical environment contained in what is termed a "configuration box" to be described in more detail hereinafter. This includes all the wires residing within the defined neighborhood of the reference wire and their physical shape. These potential wire positions are then labeled in an arbitrary but well-defined manner, e.g., 1–25 for a 5-by-5 system.

In the next step, generating masks for valid pairs (33), a valid pair consisting of a reference/target wire pair known to be well centered and within the pre-defined "reach" of each other is selected. A list of all such pairs is, usually, manually constructed. The number of such pairs is small. The list of allowed pairs is then sequentially numbered, the pair number of a specific wire configuration serving as the highest-order index of a database entry. For each valid pair, a series of electrostatic simulations are undertaken to determine which wires in the potential environment (other than the reference and target wires themselves) have a strong impact to the reference-target coupling capacitance or the reference self-capacitance. The list of those wires form the 'strong' mask, their presence being marked by a "1" in a binary number representation of all possible wires in the configuration box (an absence of a wire is noted by a "0"). Again, based on the results of many hand-run simulations, the wires whose presence or absence matters only to a lesser degree are included to form a 'weak' mask. The balance of the wires are included in the 'environment' mask. These masks, which will be described hereinafter in more detail, along with the pair number, structure the database and their judicious selection is responsible for the accuracy of this method. The index into the database can be obtained by bit-wise (bit-by-bit) AND'ing the masks and the configuration number.

The next step consists of creating a 3-D database (34). All standard width/spacing wire configurations yielding unique indices are set up, and the coupling and self-capacitance is calculated and stored in the database.

The hierarchy of the indexing system gives the database its accuracy and structure and is expressed as follows:

<pair number> <strong bits> <weak bits>

(most significant)←(least significant).

The pair number is obtained during the "slicing" step (36) which selects a reference/target pair number, wherein the pair is centered inside the configuration box. The "slicing" step also determines the local environment of the pair, embodying this local environment (i.e., all the other wires located in the vicinity of the pair) in a binary "configuration number". The strong and weak components of the total index are obtained by a bit-wise overlay of the corresponding mask and the total configuration number (37). The generation of the database is undertaken by enumerating through all "rough" indices and storing the capacitance from the corresponding physical wire pattern.

Prior to any analysis, the database of 3-D patterns (34) is generated for a given technology, for all different (uniform) wire widths and grid spacings which will be utilized. This database is employed for the extraction process. After performing a detailed wiring (35), the wires are "sliced" into 3-D patterns (36), which exhibit a "pattern" of the form shown in FIG. 4. A straightforward method, which is described hereinafter, is used to obtain the pattern index (37). After determining the pattern index, the database is queried (38) to obtain the capacitance, and if desired, the resistance and inductance values (39). This index corresponds to a 3-D pattern on a specified grid and with a specific conductor width. If the actual wire is not on-grid or has a non-standard width, this will be noted by the "slicer" (43), and the information will be passed to a parameterization module (42) which computes the parasitics for the widths and spacings of the actual wire. The parasitic information is forwarded to the "reconstruct" module (40) which stores connectivity information, i.e., which pattern belongs to which wire, which wire belongs to which net, etc. Using the parasitic and connectivity information (45), a distributed RC or RLC extracted netlist is created (41).

Figure 3:
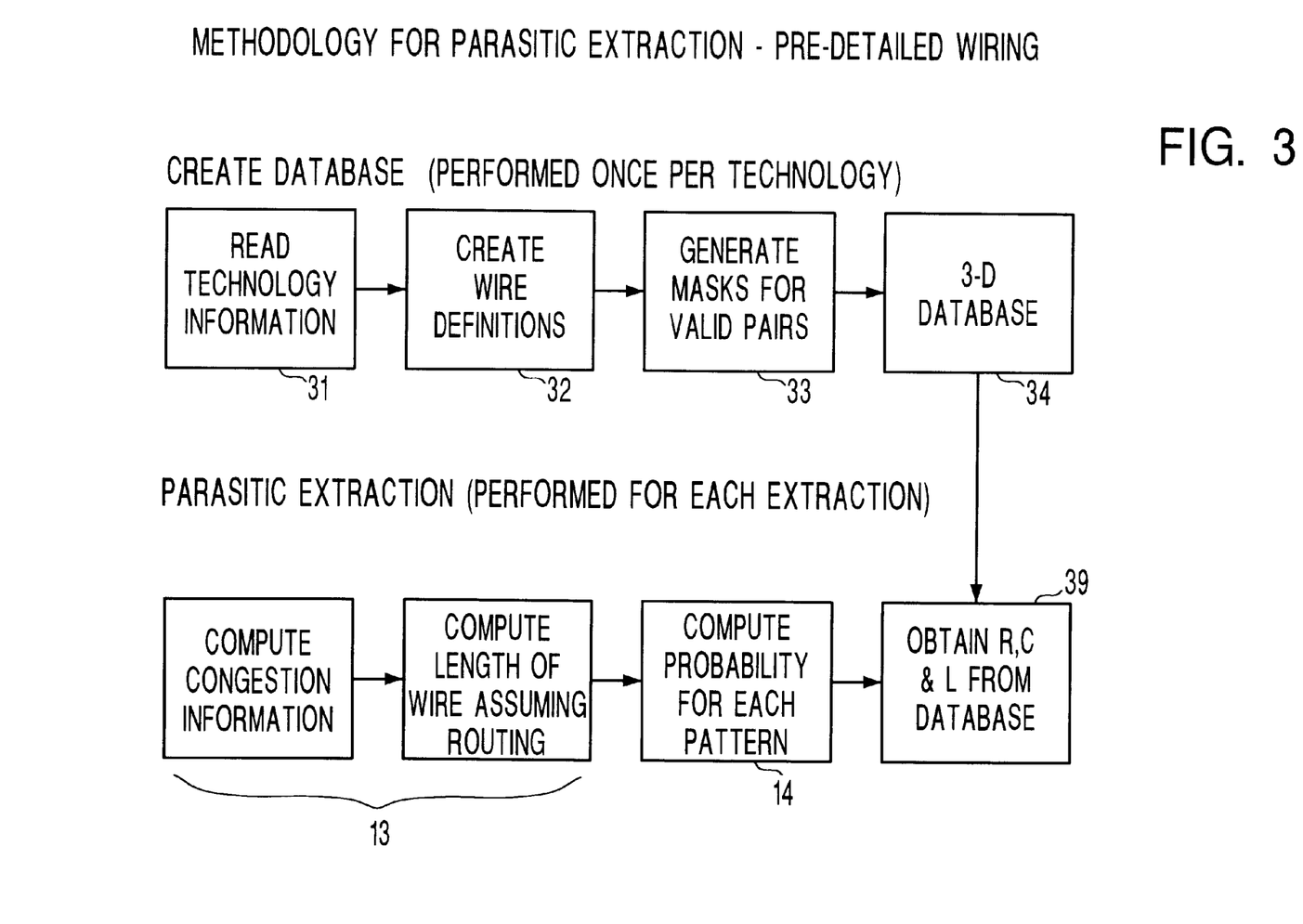
FIG. 3 shows a sequence of steps for extracting parasitics in a pre-detailed wiring phase, in accordance with the present invention.

FIG. 3 shows how extraction is performed prior to performing a detailed wiring of the chip, in accordance with the invention. Assuming a Stiner tree routing, (as opposed to pin-to-pin connections), an estimation of the length of a wire and any congestion which a wire may encounter is computed (blocks 13). The database of patterns is used to find the "average" capacitance given the number and the relative position of the adjacent wires. Capacitance is computed by statistically estimating the number of times each pattern is encountered for a given wire (blocks 14), in accordance with the following equation:

$$C(wire) = C(pattern) * P(pattern)$$

wherein C(wire) is the capacitance of the wire per unit length, C(pattern) is the capacitance per unit length of the pattern, and P(pattern) is the probability of encountering the pattern for the given wire. These probability numbers are obtained by taking into consideration congestion information associated with the wires.

Figure 4:
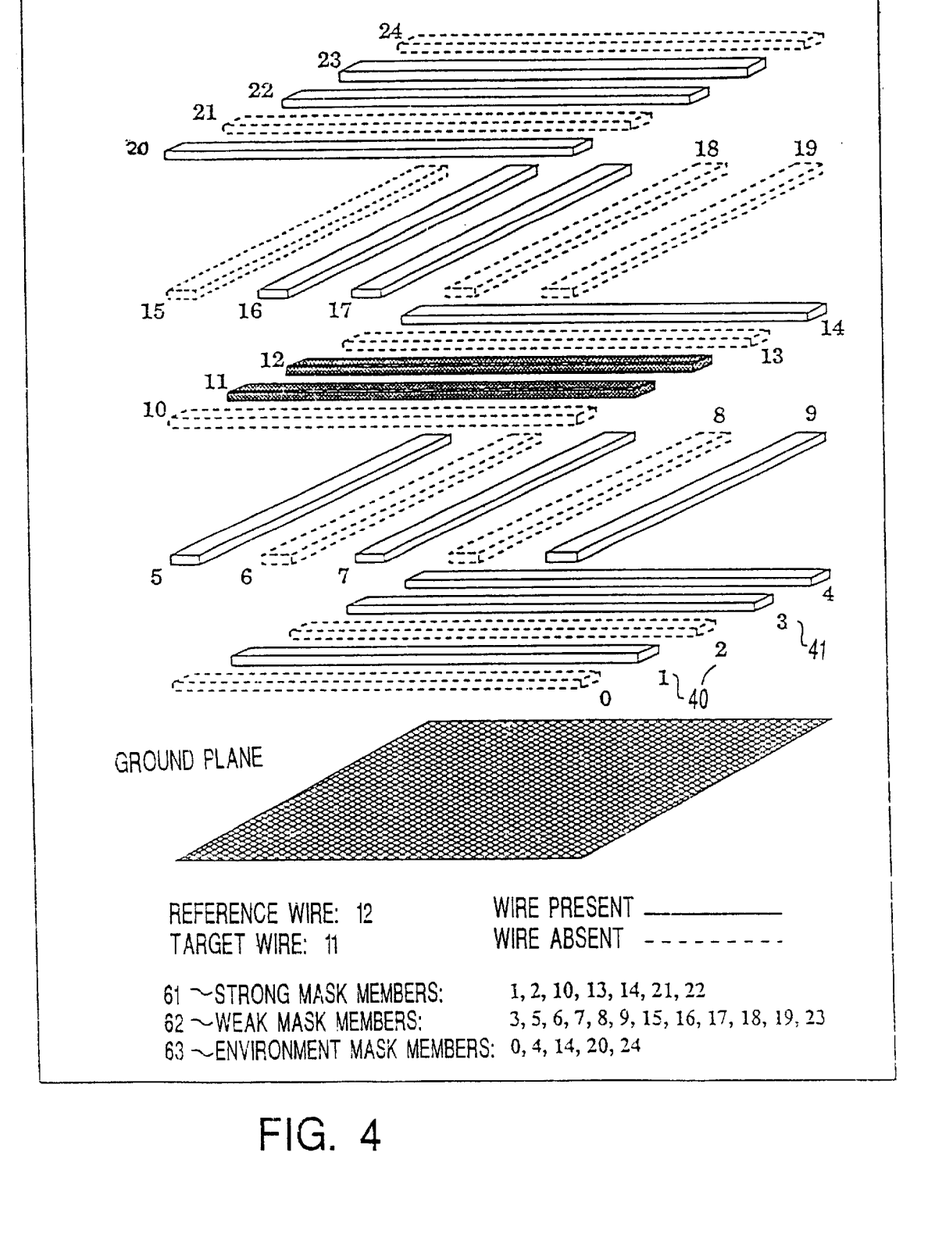
FIG. 4 illustrates a typical conductor configuration exemplifying strong, weak and environment masks for a pair of conductors in a 5-layer system with reach-2.

FIG. 4 shows a typical pattern and several key features and definitions used in the present invention. Two types of 'masks' (i.e., clusters or groups of wires) are shown, namely, a 'strong' mask (61) and a 'weak' mask (62). For a given 'reference wire', i.e., a wire for which the self and mutual capacitance or inductance are to be found with respect to the 'target wire', the surrounding conductors have either no impact, little impact or a strong impact on the self and mutual parasitics. These are, respectively, characterized as environment (63), weak (62), and strong (61) mask members. An important feature of the invention is the observation that many different patterns have the same parasitic value within a certain error bar, and further, that these patterns can be clustered using only the strong and weak masks mentioned above (environment masks being purposely ignored).

Figure 5:
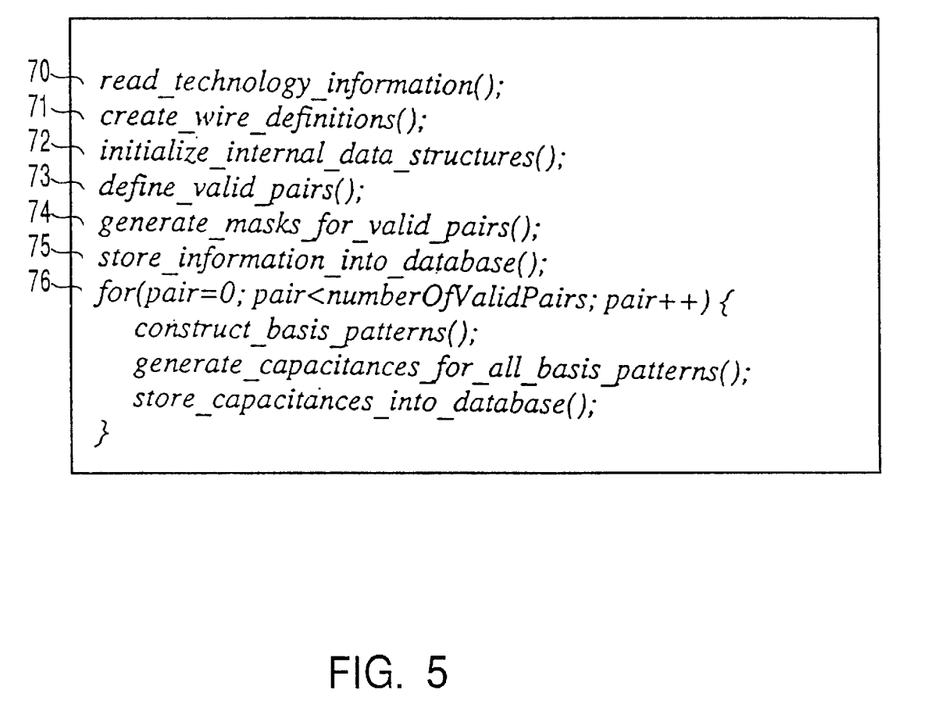
FIG. 5 is an algorithm illustrating pseudo-code for generating a database of parasitics from various masks.

FIG. 5 is a pseudo-code algorithm for generating the database of parasitics from the various masks. The first step consists of reading technology definitions (70), e.g., the vertical and horizontal spacings, the dielectric constants, and the like. The second step consists of creating wire definitions (71). By way of example, in a two-wire system, wherein either the first or second wire is present (or absent), there may be three wire definitions 01, 10, and 11 (a 1 representing the presence of the wire, and a 0, its absence). The internal data structures are then initialized (72) based on the wire definitions. Valid pairs are then defined (73), (the definition of a valid pair of wires being described in more detail hereinafter). Strong, weak and environment masks are then created (74) for the geometry (e.g., such as that shown in FIG. 4) and stored in the database. Thereafter, and using the masks, a unique set of basis patterns is generated (75). For each unique set of patterns, a field solver is run to generate the parasitic values (76). These are stored in the database (77).

Figure 6:
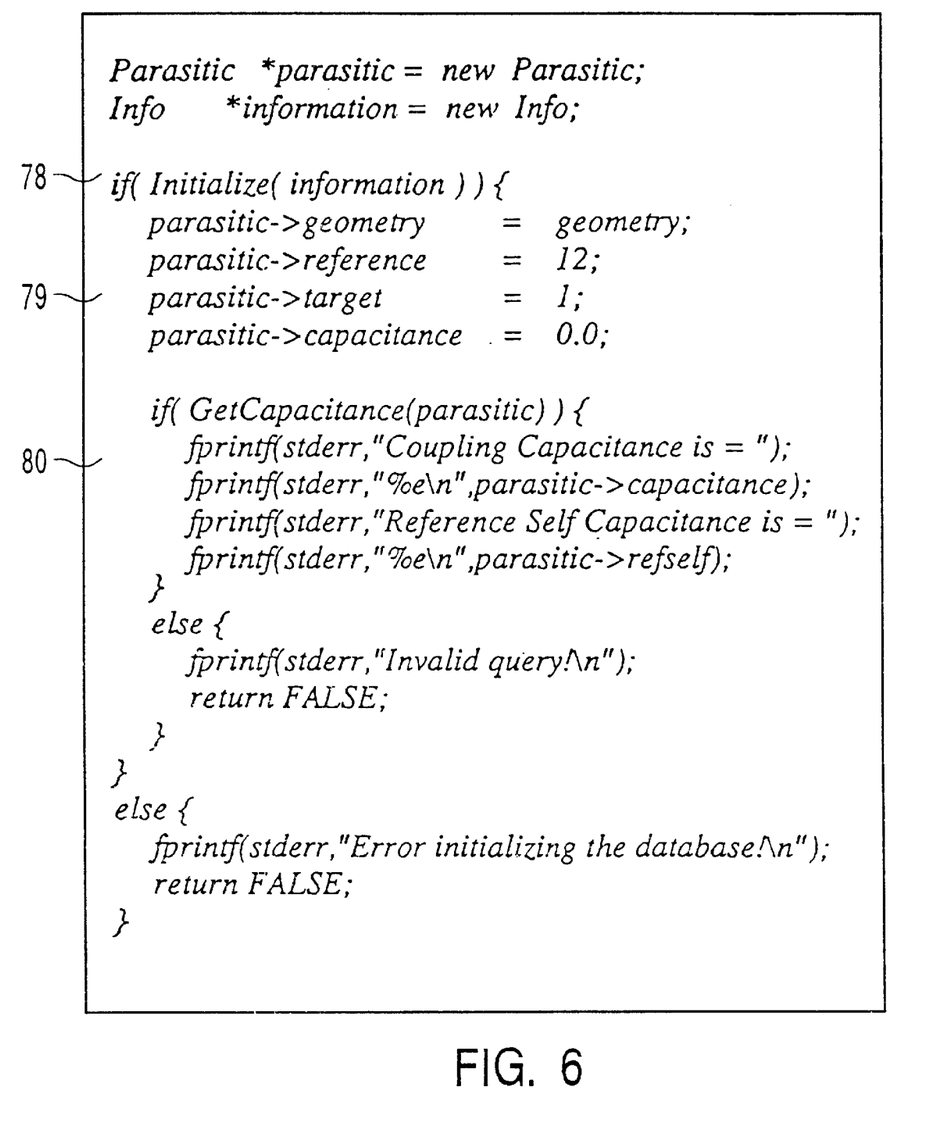
FIG. 6 shows an algorithm used to query the database to obtain parasitic values.

FIG. 6 shows a sample pseudo-code for querying the database for parasitic values. For each 'slice', the pattern information is initialized (78), and the geometry (e.g., 5×5× 5, 3×3×5, etc.), the reference, and the target are determined. By way of example, in the present case, the capacitance is initialized to 0. The database is then queried (79) with the index appropriate to the pattern, and an appropriate parasitic value is returned (80).

Referring now back to FIG. 4, the pattern recognition and the algorithm that provide extracted parasitics in the amount of time it takes to query a database will now be described in detail. The constraints imposed on the system are as follows:

1) The accuracy must remain within at least 5% of an accurate 3-D field solver solution, and preferably not more than 10% in a worst case.

2) The time spent obtaining the extracted coupling and self-capacitance must be minimized such that it can be used in real time (i.e., targeted for about 50 machine instructions).

The 3-D structures which are stored in the database capture all the important 3-D effects such that no Boolean operations are required to recompose the 3-D structure. The parasitics for each entry are pre-computed and stored in the database. Any interconnect is broken-up into line segments that fit the size of the configuration box. The database is queried to obtain the resistance, capacitance and/or inductance for that slice, and a network of RCs is then structured. The completed network can be reduced using standard model-order-reduction techniques. A net-by-net coupling resistance and capacitance can also be computed.

Referring back to FIG. 3, the extraction flow is as follows:

It will be assumed for sake of simplicity that all the conductors are embedded in a uniform dielectric medium. Furthermore, only a capacitive extraction will be described in detail since resistance computations are relatively straightforward and independent of the environment of the conductor. Inductance computation follows exactly the same procedure as capacitance computation.

Figure 7:
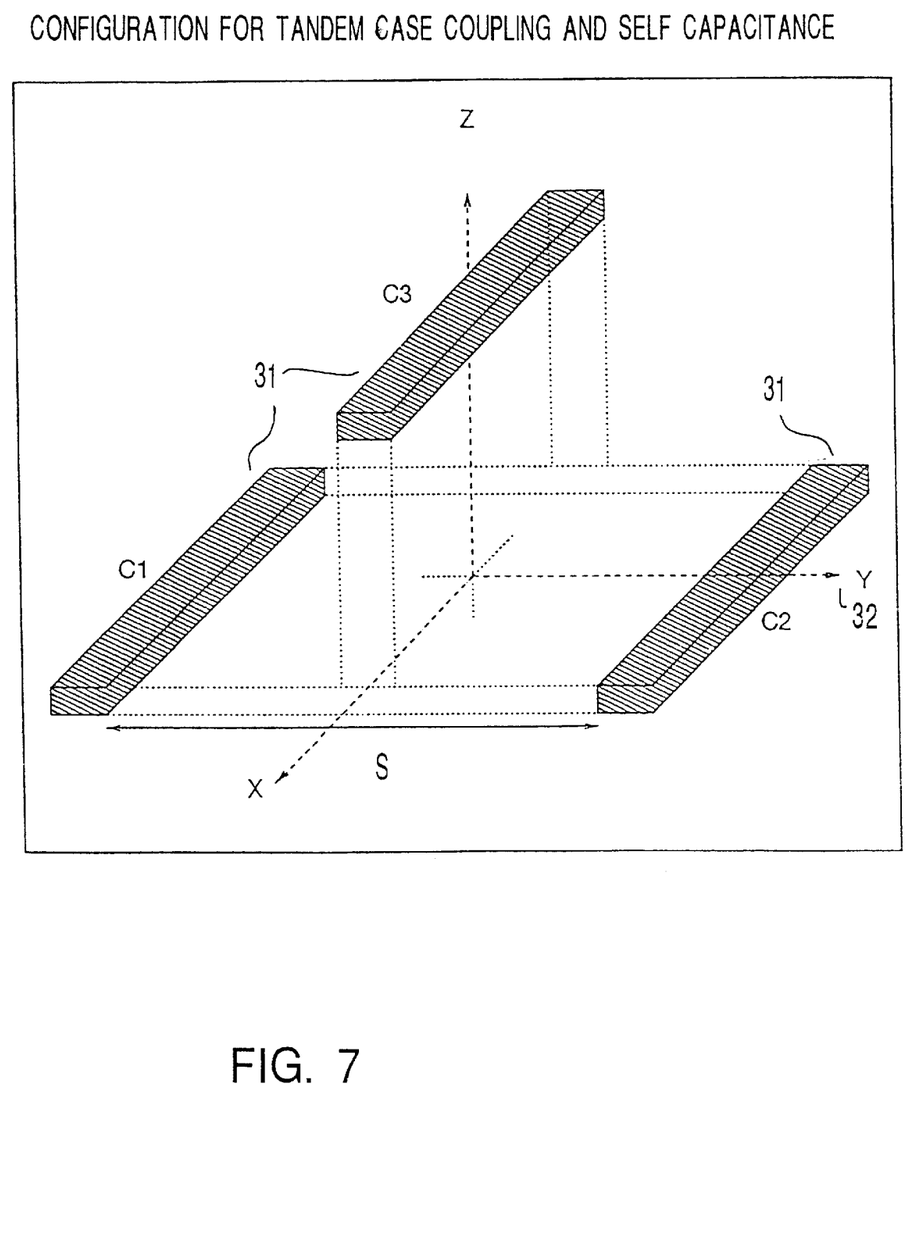
FIG. 7 illustrates a geometry used to study off-grid and variable width parasitic computation, in accordance with the present invention.
Figure 8:
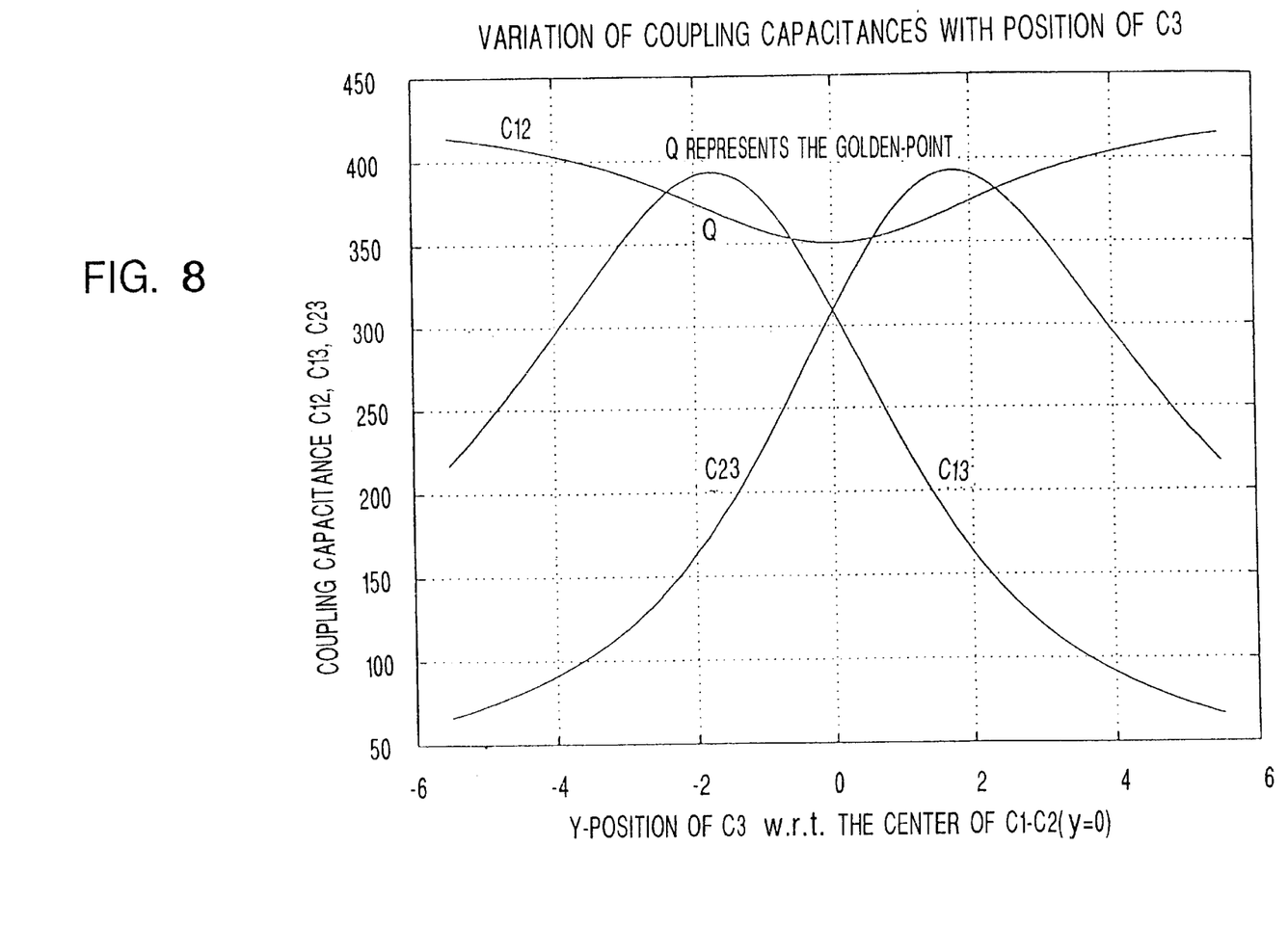
FIG. 8 is a plot illustrating the variation of coupling capacitance with position of a conductor C3, wherein coupling capacitances C12, C13 and C23 are plotted versus y-positions of C3 with respect to the center of C1–C2 (y=0)
Figure 9:
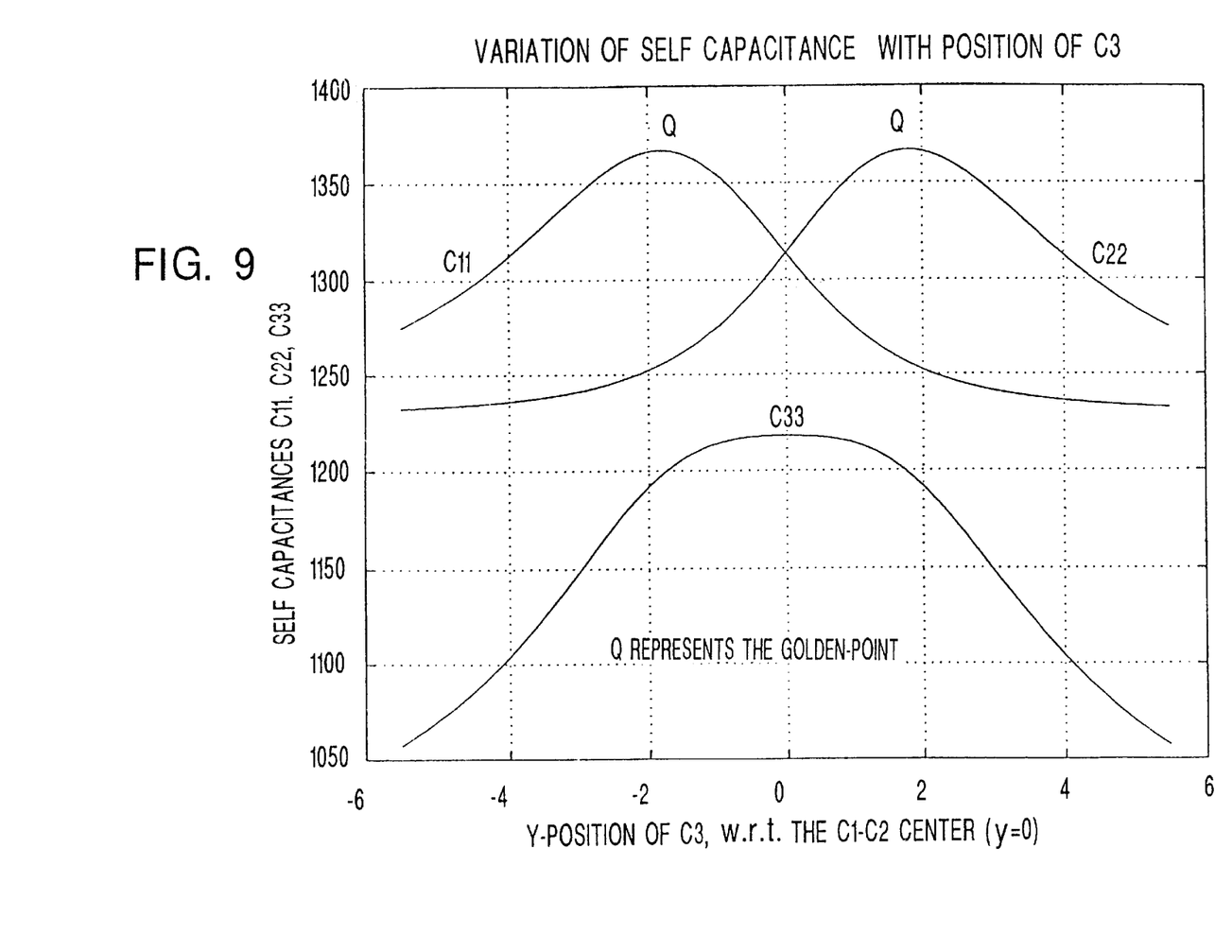
FIG. 9 is a plot illustrating the variation of self-capacitance with position of C3, wherein self-capacitances C11, C22 and C33 are plotted versus y-positions of C3 with respect to the center of C1–C2 (y=0).

The technique for minimizing an otherwise infinite number of patterns is described in two parts. The first part considers only a system of wires which fall on a specific grid with each wire having a specific width (FIGS. 4, 5 and 6). The second part, which involves model parameterization, describes wires on an arbitrary grid and having varying widths (FIGS. 7, 8 and 9). The database stores only data from uniform, regular wire systems and relies on low-order polynomial extrapolation based on coefficients stored for each reference/target pair and for each strong mask wire to account for variations of wire width and spacing.

The Gridded Wiring System:

A multilayer system of conductors of constant widths and constant surface-to-surface separation between parallel conductors on the same layer is considered. The thicknesses of the conductors may vary across layers, but it is required that it be the same for a given layer, which is, generally, the case. It is further assumed that the wiring on a given layer is orthogonal to the layers immediately above and below it, i.e., alternate layers are assumed to have orthogonal wiring.

Gridded wiring models having constant wire widths and uniform separation make use of inherent symmetries and electromagnetic shielding effects to find these basis patterns. The wiring models effectively represent all possible configurations, given a desired accuracy. This is possible in view of many geometrically differently looking patterns giving rise to the 'same' coupling capacitance between wires of interest.

The process of extracting parasitics from the electrical network is based on pattern recognition used in conjunction with the database of precalculated parasitic values for various wire configurations characteristic of a given technology.

Model Parameterization:

The inventive method also addresses variable wire widths and variable separations which are, typically, the case for more complex patterns. Variations of coupling capacitance between two conductors are considered as a function of their separation and width and, additionally, the width and separation of surrounding conductors that affect coupling. As will turn out, it will be sufficient to approximate the models with low-order polynomials (typically guadratics or cubics) in all these parameters for the desired accuracy.

Once the aforementioned two independent problems have been solved, the two approaches are unified to find a general solution for the extraction of the capacitance. As will be shown, the manner described of dividing the problem provides an efficient and accurate extraction method in terms of resource consumption and speed.

Gridded Wiring Systems:

The analysis will be restricted to a 5-layer system to facilitate the understanding of the inventive method which can be generalized to any multilayer system. For this purpose, a set of new terms will be defined with reference to FIG. 4. The physical and geometrical significance of the terms will also be explained in greater detail.

Terminology Definitions:

The Configuration Box:

It is a hypothetical 3-D box that defines the boundaries of the conductors under consideration. It has a square base to ensure that all the conductors will be of the same length within the box. The height of the box extends from the ground plane to the topmost metal layer, while the width and the depth (which are identical) of the box are decided by the constant width and spacing between adjacent parallel conductors on any given layer and within 'reach' (defined below). By way of example, FIG. 1 represents a configuration box of a 5-layer system having a reach=2.

Reference Wire:

A reference wire, also referred to as "victim wire" (or interconnect) is subject to coupling noise from surrounding wires in a given pattern of conductors. It is necessary to center the reference wire on the layer it is part of within the configuration box. (Note: This can always be achieved without loss of generality and yields better and more accurate results).

Target Wire:

A wire, the effect of which is being considered on the reference wire of a given pattern. When the target and reference wires refer to the same conductor, it implies that the effect of all surrounding wires on the self-capacitance of the reference wire are being considered.

Reach:

The farthest distance from the reference wire (in units of the grid-pitch) up to which coupling effects are deemed significant. While "reach" is generally given as a parameter, its value is restricted to 2 or at the most 3. These values were selected to be optimal for achieving the desired accuracy. A value of 2 is sufficient in most instances, especially when the configuration box is not very large.

For every reference-target pair it is realized that certain surrounding interconnects strongly affect the coupling between them. There are some that affect this coupling collectively, and then there are others which make little or no difference to the reference-target coupling capacitance. In order to classify these three different groups of wires, three new terms require definition:

Strong Mask:

The group of conductors, surrounding a pair of reference wires and the target conductors, the presence or absence of which individually causes large variations in the coupling capacitance between the reference and the target conductors, i.e., each wire individually affecting capacitive noise by a significant amount. By way of example, wires that are "sufficiently close" to either the reference wire or the target wire and which are parallel to them will have a strong effect on the reference-target coupling and, hence, will belong to the strong mask.

Weak Mask:

A group of conductors that collectively affects the coupling between a given reference-target pair, i.e., in terms of their count of how many conductors are present in the group regardless of which group they belong. These groups are defined one for each metal layer, assuming that the wiring on the metal layers are alternately orthogonal. Conductors on the layers that are orthogonal to the reference and the target conductors affect reference-target coupling approximately by their total count (percentage metal coverage) rather than by their exact position.

Sub-weak Masks:

If further improvements in accuracy are necessary, the weak mask may be broken into several weak sub-masks corresponding to physically related sub-groups of wires, the weak mask wires in a given layer, for example. Each sub-weak mask is then treated separately and contributes to the index as a variable-base number. This improvement in accuracy comes at the expense of an increase in the size of the database. For instance, a weak mask with 8 wires corresponds to 8 indices. Those 8 wires can be broken up into a group (weak sub-mask) of 3 and another of 5, yielding 15 indices and database entries.

Environment Mask:

Conductors lying outside the reference and target, strong and weak masks have virtually no significant effect on the coupling capacitance between the reference and target. These conductors belong to the environment mask. Average configurations with none and all the environment wires further improve the accuracy that is already within less than a few percents (i.e., <5%) of the 3-D field-solver solution.

The problem can be further simplified by centering the reference conductor with respect to surrounding wires in a given layer. This can always be achieved by properly defining the configuration box. Similarly, for a target conductor on an orthogonal layer, can also be centered without loss of generality. This further imposes the accuracy of the method, while reducing the size of the database.

Generation of Masks

Once the simplifications mentioned above are applied, one only needs to concentrate on a small number of reference-target pairs (which turns out to be about 56 for the case of a 5-metal layers system with reach=2) as against all the 325 possible pairs in the prior art. Equipped with these unique and what will be termed as 'valid' pairs of reference and target conductors, a set of strong and weak masks for each of these pairs are defined. The masks were chosen after examining the electromagnetic shielding effects and symmetry properties of each of the pairs. A 64K pattern simulation was run for all 56 pairs (about 1200 patterns per pair) to check the validity of the masks. Histograms of capacitance values for each pair were constructed that were equal to the desired accuracy (approximately 95%) to determine the best choice of strong and weak masks.

As an example of mask generation, and with reference to FIG. 4, let it be assumed that one is interested in finding the masks for the pair of conductors numbered 11 and 12. As depicted in FIG. 4, conductors 10, 13, and 14, being parallel to the reference (12) and target (11) and being on the same layer, they will very strongly effect their coupling capacitance. Similarly, conductors identified as 1, 2 and 21, 22 are, respectively, parallel to and directly above and below the reference and target. Hence, they will contribute to the strong mask. Alternatively, conductors on layers 2, 4, viz. 5, 6, 7, 8, 9 and 15, 16, 17, 18, 19, being orthogonal to the reference and to the target, will contribute to the weak masks since what matters is how many, rather than which, conductors are on the individual layers. For example, whether 5, 7, 9 are present or whether 6, 7, 8 are present, they should yield almost identical results. Similarly, 15, 17, 19 will have the same effect as that of 16, 17, 18. It should be noted that the differences will be within acceptable error limits.

Creation of the Database

Having chosen the masks properly, a database is created of all the capacitance values for all the valid pairs in a given mask (strong/weak). For the aforementioned case, 58k capacitance values were computed, which were calculated using the C3D field solver (a 3-D capacitance solver which makes use of known boundary element techniques typically used for solving electrostatic problems). The generation of the database takes approximately the equivalent of one full CPU-day on an IBM RISC System/6000 Model 590 with a 130.4 DP-MFLOPS rating. For a system of 6 wiring layers and 2 tracks on either side of the 'affected' wire, the size of the database is reduced from a billion patterns to about 64k different patterns, consuming less than 4MB of memory and with a database access time equivalent to some 50 machine instructions.

An efficient and quick indexing mechanism finds the index for a given input pattern in the database. The inventive method does not search for patterns in the database, but rather the input pattern is used to directly derive the index of capacitance value for the pattern in the database. The process of indexing requires less than 50 instructions. The pseudo-algorithm used in the generation of the database is described in FIG. 5.

Accessing the Database

Using bit-patterns is an efficient way of defining wires in a given configuration box. Accordingly, for a 5-layer and reach=2 configuration, there are:

$$\text{layers} * (2*\text{reach}+1) = 25 \text{ wires}$$

which are represented as the first 25 bits of a long 32-bit binary number. A 1 implies that a wire at that location exists, whereas a 0 implies the absence of a wire at that location.

Furthermore, the reference and the target wires are specified by their number in the bit pattern. Thus a geometry defined as:

0100111010101101110101101000000 implies that the wire numbers 2, 5, 6, 7, 9, 11, 13, 14, 16, 17, 18, 20, 22, 23, and 25 are present, while the remaining are absent. The capacitive coupling effect of wire 2 on wire 13 is specified as:

reference=13; target=2;

A database of masks is created for each of the reference-target pairs stored in the internal data structure. A number of different possible patterns is calculated that will exist for each of the pairs and which is given by $$2^s \times \prod_{l=1}^{L} (w_l + 1)$$

wherein s is the number of strong mask wires and $w_1$ is the number of weak mask wires, in subweak mask 1 (of L possible sub-weak masks). Since s and $\{w_1\}$ are dissimilar for different pairs, there generally exists a different number of patterns for different pairs. The accurate 3-D field-solver C3D can be used to solve for each of these patterns of each pair and store the patterns in the database. One may directly map the pattern into the database index. Thus, in essence, in the method of this invention, the input pattern directly translates into a valid index in the database, given a valid reference-target pair.

Non-uniform, Non-gridded Wire Systems (model parameterization)

FIG. 7 depicts a geometric configuration used to study off-grid and variable-width parasitic computation. Off-grid and variable-width computation is done by parameterization of gridded parasitic results and extrapolation using a golden value of the parasitic for a corresponding gridded case and four parameters which are a function of the actual position and width of the conductor. The four parameters for each reference/target pair account for all width and spacing deviations from the standard case stored in the database. For example, in the case where three wires are present, the variation of one of the three (31), with a change in position in the y-direction (32) is shown in FIG. 8. Therein is shown the coupling between conductor 1 (32) and conductor 3 (31), labeled C13 as a function of the y-coordinate, as well as C23 and C12. FIG. 9 shows the variation of the self-capacitance as a function of the position of conductor 3.

Referring now to FIG. 8, an example is shown wherein three wires are present. The coupling between conductor 1 (i.e., 32) and conductor 3 (i.e., 31), labeled C13, is plotted as a function of the y-coordinate. The same applies to the coupling between conductors 2 and 3, i.e., C23, and conductors 1 and 2, i.e., C12. The variation of coupling capacitance is shown for one of the three (C31), with a change in position in the y-direction (C32).

FIGS. 8 and 9 address the problem of non-uniform wire spacing and wire width, which are intentionally not stored in the database. To reiterate, the database only contains (self and coupling) capacitance values for regular and uniform wire patterns. Deviations from this case are treated as (easily modelable) perturbations to the uniform case. The net capacitance is then simply the sum of the closest value of the pattern stored in the database (uniform part) and a correction term. This correction term is calculated by a low order polynomial function (typically quadratic or cubic) of the deviation from a standard, regular configuration. This regular configuration refers specifically to a standard spacing or width. The discussion, though, will be limited to the case of a non-standard spacing. Similar steps are used to handle non-standard widths. While the use of bi-quadratic or bi-cubic functions might in principle provide higher accuracy to the correction terms, it was found sufficient to use two decoupled quadratic or cubic functions, the correction terms being generally small enough to render negligible any interaction between the correction(s) associated with spacing and width variations.

The first issue to be addressed is calculating and storing the coefficients which determine the deviation from the standard capacitance value stored in the database. This is done for all three pairs of wires (C12, C23, C13) as a function of position of the center of conductor C3, as was previously shown in FIG. 7. C12 refers, for example, to the coupling capacitance between wire 1 and wire 2. The capacitances are seen to be a smooth function of the position of C3, allowing the use of a low-order polynomial (generally more or less) equation to model the deviation. To give a concrete example, let us assume the use of a quadratic equation, requiring two parameters other than the mean vale stored in the database. Two of the coefficients are used to correct for non-standard width and another two for non-standard spacing. For non-standard widths, the ratio of the widths is used as the function variable. Only the last two are used here. The four coefficients need only be stored for each strong-mask wire in a given reference-target wire pair. The actual calculation of the coefficients is done manually using a standard least-squares fit to the polynomial of choice (quadratic or cubic) after completing the generation of the strong mask (one per technology). These coefficients make it possible to calculate the non-uniformity correction to the base case, as will be illustrated hereinafter.

Since the coefficients have now been determined, the (standard) database entry closest to the non-standard case of interest is selected. By way of example and represented below is a case of non-uniform spacing, wherein the third wire is offset from the standard position (shown on the bottom line) by 25%:

```
- - - + - - - + - - - + - - - + - -
   X      X       X   X       (non-uniform spacing)
   X      X       X   X       (standard case stored in
                                database)
```

The Xs represent wires viewed in cross-section. In this instance, the standard case nearest to the non-uniform case of interest is represented by a configuration bit pattern (binary number) of 1111 wherein, as before, a "1" represents the presence of a wire and a "0", its absence. The pattern of the nearest case (1111) is used to look-up the standard capacitance, retrieve it, and begin to estimate the correction that is applicable to it.

To determine the correction term, the deviation from the standard case is measured (e.g., 0.25). This term is used along with the coefficients for the off-centered wire (Coeff_1, Coeff_2) to obtain the correction term (C_correction) as follows:

$$C\_correction = Coeff\_1 * 0.25 + Coeff\_2 * (0.25^2)$$

Where higher order terms could also be added (e.g., Coeff_3*(0.25³). The correction term thus calculated can now be added to the base case which was given by the closest pattern (1111), yielding the final result (C_final):

C_final=C_base(1111)+C_correction

FIG. 9 shows the self-capacitance of the same three wires as a function of the position of the conductor (wire) C3. Identical arguments and procedures are followed for the self-capacitance.

The coupling and self-capacitance of FIGS. 8 and 9, respectively, are seen to be smooth functions of the position of C3, and are, therefore, easily modeled by low-order polynomials.

The following steps are taken to extract parasitic information from the database for arbitrary wire widths:

1. The closest "gridded pattern" index is computed. By way of example, if there are two wires having a cross-section of the wiring configuration shown below:

(a)

wherein the horizontal lines represent wire lying in the plane of the page, X represents a wire-viewed on end and Y represents the target or the reference wire. The closest gridded pattern to the above configuration (a) would be:

(b)

and an index for the pattern 1111 corresponding to (b) is then calculated.

2. The four coefficients (for quadratic correction functions) corresponding to all possible widths and spacings, which were stored for each strong mask wire for a given pair number, are queried from the database.

3. The gridless parasitic of arbitrary width is computed using the gridded, standard-width parasitic as the mean value, and extrapolating using the above four coefficients. In the previous example, assuming all the wire widths to be the same, the deviation from the grid may be 0.25 (i.e., ¼ grid spacing). Then:

C(gridless)=C(pattern)+Coeff_1*0.25+Coeff_2*(0.25²)

wherein C(pattern) is the standard width/spacing case capacitance stored in the database and retrieved using the pattern based index. C(gridless) is the non-uniform case whose capacitance is of actual interest, Coeff_(1) and Coeff_(2) are the linear and quadratic term coefficients of the fitted function describing the variation in capacitance as a function of the position of C3 (i.e., 0.25 of a spacing to the right of the center). An identical equation and approach are used to account for wire width variations, where the ratio of wire widths would replace the position deviation in the correction term calculation.

Through this technique, it is now possible to provide an accurate estimate for the general case of non-uniform wire width and spacing, while keeping the database size to a minimum. Furthermore, highly accurate parasitics can also be computed for varying widths and wire separations.

At this point, a structure called 'parasitic' has been defined having a reference, a target, a capacitance and a geometry (pattern) as some of its representative fields. In order to query the coupling capacitance between any two wires (reference, target) one can fill the fields of the 'parasitic' data structure and forward it to a function named GetCapacitance, which queries the database using a computed index to calculate the parasitics.

While the invention has been particularly shown and described with reference to an exemplary embodiment, those skilled in the art will recognize that various changes in form and detail may be made therein without departing from the scope of the invention. For example, it will be understood by those skilled in the art that the process of extracting parasitics both in the pre-detailed and post-detailed wiring may entail using different field-solvers, extending the number of layers or the reach of the configuration box, using parameterized correction functions other than the low-order polynomials described above, splitting or combining the various steps or even replacing some of the steps with others providing the same function to different integrated circuit packages other than chips, such as single-chip modules, multi-chip modules, cards, boards and the like.

What is claimed is:

1. A method of extracting in parasitics real-time from an electrical network representing a three-dimensional wiring of an integrated circuit chip after completing an initial pass of the wiring of said chip, the method comprising the steps of:

a) partitioning said wiring into recognizable patterns;
   b) querying a database of precomputed values of said parasitics of said recognizable patterns;
   c) recomposing said electrical network from said initial wiring and said precomputed parasitics; and
   d) storing in said database coefficients of low-order polynomials, polynomials corresponding to recognizable patterns having a different wiring width or a different wiring spacing.

2. The method as recited in claim 1, wherein said parasitics are selected from the group consisting of resistance, capacitance and inductance.

3. The method as recited in claim 1, further comprising the steps of:

creating within a predetermined error a set of strong and weak masks for determining which of said recognizable patterns yield the same ones of said parasitics, and for providing the sequencing of entries into said database;
   running for a manageable set of said recognizable patterns a field solver for generating selected ones of said parasitics;
   within a predetermined number of machine cycles, indexing each of said recognizable patterns using a referencetarget pair number associated with a unique set of said strong masks and said weak masks;
   storing in said database each of said selected parasitics corresponding to each of said recognizable patterns having appropriate ones of said indexes; and
   storing in said database coefficients of low-order polynomials, said polynomials corresponding to said recognizable patterns having a different wiring width or a different wiring spacing.

4. The method as recited in claim 3, wherein said coefficients correspond to two types of said polynomials, a first type of said polynomials providing a correction to said wiring having an irregular spacing and a second type of said polynomials providing a correction to wiring having an irregular width.

5. The method as recited in claim 4, wherein only selected ones of said coefficients corresponding to a bit which represent a wire in said strong mask are stored in said database, wherein said strong mask is associated with said reference-target pair number on a one-to-one basis.

6. The method as recited in claim 3, wherein said predetermined error is approximately 5%.

7. The method as recited in claim 3, wherein said predetermined number of machine cycles is approximately 50.

8. The method as recited in claim 3, wherein said parasitics are computed with an accuracy comparable to that of a three-dimensional field solver.

9. The method as recited in claim 3, wherein said three-dimensional environment includes at least three levels of said wiring.

10. The method as recited in claim 1, wherein said step of recomposing said electrical network further comprises making approximations of wiring congestion and wiring length.

11. The method as recited in claim 1, wherein said parasitics from said electrical network are extracted in real-time.

12. The method as recited in claim 1, wherein said precomputed parasitics are stored in said database.

13. The method as recited in claim 12, wherein the number of said parasitics stored in said database is reduced by taking into account strong and weak interactions between said three-dimensional wiring.

14. The method as recited in claim 1, wherein said database includes precomputed parasitics of said wiring having varying separation and wiring width.

15. A method for extracting parasitics in real-time from an electrical network representing a three-dimensional wiring of an integrated circuit chip, prior to completing an initial pass of the wiring of said chip, the method comprising the steps of:

a) performing a physical design of said chip by executing a floorplanning and placement;

b) selecting a routing for a first wire which connects two pins of said chip;

c) computing a percentage of encounters between said first wire and groups of wires in close proximity to said first wire, said group of wires traversing said first wire;

d) querying a database of precomputed values of said parasitics of each recognizable pattern and computing a probability of said encounters occurring; and e) determining an accurate estimated parasitic for each of said recognizable patterns by summing up the product of said precomputed parasitics of each of said recognizable patterns and said probability of said encounters.

16. The method as recited in claim 15, wherein the accuracy of said estimated parasitics is approximately 5%.

17. The method as recited in claim 15, wherein said groups of wires include 1, 2 or 3 wires.

18. The method as recited in claim 15, wherein said routing is a Stiner tree.

19. The method as recited in claim 15, wherein parasitic capacitance is determined by statistically estimating the number of times each of said patterns is encountered for said first wire, in accordance with equation (1):

$$C(wire) = C(pattern) * P(pattern), \tag{1}$$

wherein C(wire) is the capacitance of the wire per unit length, C(pattern) is the per unit length capacitance of said pattern and P(pattern) is the probability of encountering said pattern for said first wire.

20. The method as recited in claim 19, wherein said parasitics and said connectivity information create a distributed RC or RLC extracted netlist.

21. The method as recited in claim 15, wherein said parasitics are instrumental in reconstructing said electrical network.

22. The method as recited in claim 15, wherein said database stores connectivity information, said connectivity information comprising which of said recognizable patterns are associated with which of said wires, and which of said wires belong to which of said electrical network.

* * * * *